United States Patent
Kyle et al.

[19]

[11] Patent Number: 6,016,304
[45] Date of Patent: Jan. 18, 2000

[54] RF PHASE AND/OR AMPLITUDE CONTROL DEVICE

[75] Inventors: Robert R. Kyle, McKinney; William F. Dixon, Flower Mound; Ronald L. Meyer, Plano, all of Tex.

[73] Assignee: Raytheon Company, Lexington, Mass.

[21] Appl. No.: 08/904,144

[22] Filed: Jul. 31, 1997

Related U.S. Application Data

[60] Provisional application No. 60/023,525, Aug. 7, 1996.

[51] Int. Cl.[7] .............................. G01R 31/08; H04K 1/02; H04L 27/14
[52] U.S. Cl. .......................... 370/206; 370/206; 370/207; 375/297; 375/326; 375/327
[58] Field of Search ................................. 370/17, 11, 109, 370/114, 118, 206, 207, 215; 375/322, 328, 329, 340, 347, 297, 326, 327; 455/304, 289, 296, 303, 305

[56] References Cited

U.S. PATENT DOCUMENTS

| | | | |
|---|---|---|---|
| 4,153,886 | 5/1979 | Miedema | 333/156 |
| 4,470,147 | 9/1984 | Goatcher | 375/77 |
| 4,581,595 | 4/1986 | Silagi | 333/139 |
| 5,019,793 | 5/1991 | McNab | 333/156 |
| 5,093,636 | 3/1992 | Higgins, Jr. et al. | 332/100 |
| 5,222,246 | 6/1993 | Wolkstein | 455/13.4 |
| 5,355,103 | 10/1994 | Kozak | 455/304 |

*Primary Examiner*—Michael Horabik
*Assistant Examiner*—Man Phan
*Attorney, Agent, or Firm*—Baker & Botts, L.L.P.

[57] ABSTRACT

An RF phase and/or amplitude control device (40) has a digitally controlled attenuator (41) at it input to adjust the overall output level of the output. The device includes an in-phase power divider (43) for splitting up the input signals over two paths (I and Q). The power divided signals in the two paths are further power divided and shifted in relative phase at 180° hybrids (49 and 50). The power divided and phases shifted signals in each path I and Q are selectively switched using switches (51 and 53). The selected and switched output is quadrative combined at a 90° hybrid (55). This provides a single inexpensive device which can provide digitally controlled output signals which are either phase controlled or amplitude controlled or both.

11 Claims, 4 Drawing Sheets

RF PHASE AND/OR AMPLITUDE CONTROL DEVICE

This application claims benefit of provisional application 60/023,525 filed Aug. 7, 1996.

TECHNICAL FIELD OF THE INVENTION

This invention relates to RF systems and more particularly to a digitally addressable RF control device for control of an RF signal.

BACKGROUND OF THE INVENTION

Radio frequency signal (RF) phase and amplitude control devices are used in a wide range of applications such as communication systems, radar systems, antenna systems, etc. It is further highly desirable that these RF control devices used for phase and amplitude control be digitally addressable devices. These RF control devices may include ferrite devices (such as ferrite phase shifters, for example) or semiconductor devices. The ferrite devices are expensive and the performance is limited. Semiconductor devices such as varactors, PIN diodes, and transistors are temperature sensitive, and therefore, resolution limited. It is therefore highly desirable to provide a high resolution RF control device for control using low cost elements.

SUMMARY OF THE INVENTION

In accordance with one embodiment of the present invention an improved RF control device for phase shifting and/or amplitude control of an RF signal is provided. The RF control device includes a power divider for power dividing the RF input to provide first and second power divided signals. The power divided signals are separately amplitude controlled by digital control means. The level controlled power divided signals are then quadrature phase combined to provide phase and/or amplitude controlled output signals. This provides a single inexpensive device which can provide digitally controlled output signals which are either phase controlled or amplitude controlled or both.

These and other features of the invention will be apparent to those skilled in the art from the following detailed description of the invention, taken together with the accompanying drawings.

DESCRIPTION OF PREFERRED EMBODIMENTS OF THE PRESENT INVENTION

Figure 1:
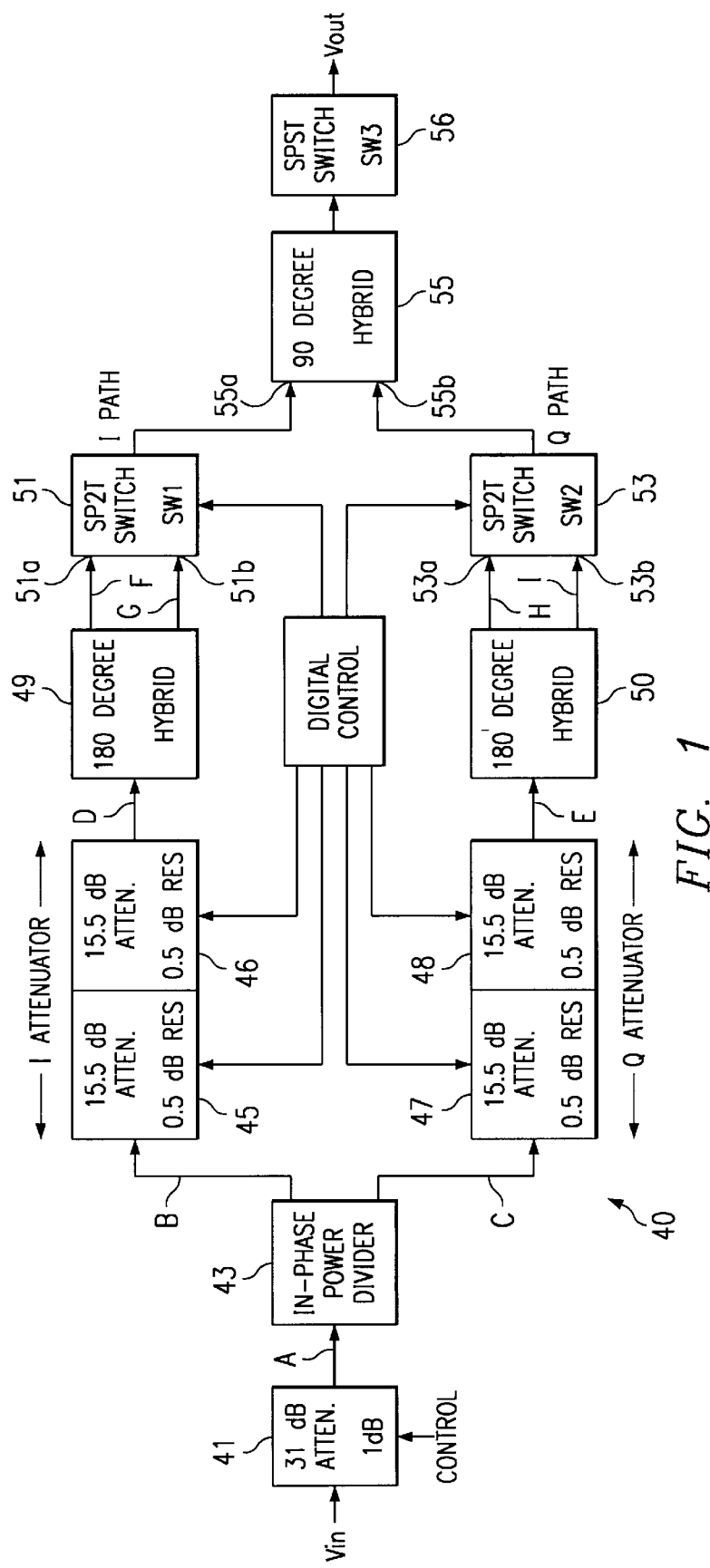
FIG. 1 is a block diagram of an RF control device according to one embodiment of the present invention.

In accordance with an embodiment of the present invention there is provided an RF control device 40 as illustrated in FIG. 1. The RF control device includes an input variable attenuator 41 which is a step attenuator that attenuates in half of dB increments from 0 to 31 dB. This attenuator 41 is digitally controlled having nine binary inputs. The attenuator 41 is implemented for example using two cascaded MA/COM AT280 attenuators each having a range of 15.5 dB in 0.5 dB steps. The attenuator 41 adjusts the overall output power level. The output (at A) from the attenuator 41 is power divided by an equal in-phase power divider 43 and applied separately to an I (at B) and a Q (C) path. The in-phase power divider is for example a MAICOM DS-327. A lower cost Wilkinson power divider may also be used. In this particular embodiment, the I path includes 15.5 dB attenuators 45 and 46 cascaded in series. Similarly the Q path has two 15.5 dB attenuators 47 and 48 cascaded in series. These attenuators 45–48 are also digitally controlled by binary inputs. They are also MA/COM T280 attenuators for example. These attenuators are low cost surface mount GaAs (Gallium Arsenide) attenuators. These attenuators can adjust the relative amplitudes of signals in the I and Q paths. The output at D and E are from the separate I and Q attenuators 46 and 48. The output at point D from attenuator 46 is applied to 180° hybrid 49 to produce two equal power (power divided) 180° out of phase shifted signals at points F and G. This 180° hybrid 49 is, for example, MA/COM HH-128 hybrid. This hybrid 49 may also be made at a lower cost using a rat race hybrid in microstrip. Likewise, the output at point E from attenuator 48 is applied to 180° hybrid 50 to produce two equal power signals that are 180° out of phase at points H and I. The hybrid 50 is also on MA/COM HH-128 hybrid, but may be a rat race hybrid. The selected output from points F or G in path I is applied by a single pole double throw switch 51 to a port 55a of a 90° hybrid 55. This switch, for example, is a MA/COM SW 29. Similarly, the selected output from points H or I in path Q is applied by single pole double throw switch 53 to the port 55b of 90° hybrid 55. This switch is also, for example, a MA/COM SW29. The 90° hybrid 55, for the example, is a MA/COM JH140. It may be made at a lower cost using a Lange microstrip hybrid coupler or branch line hybrid coupler. The outputs from the I path and the Q path are then combined through the 90° hybrid 55. The output is provided via SPST (single pole single throw) switch 56.

The 180° hybrids 49 and 50 followed by SP2T switches 51 and 53 establish which quadrant the vector is in while the 90 degree hybrid, 55, vector combines the I and Q magnitudes orthogonally.

The mathematics of this vector weighter are summarized below and references are to locations shown on the block diagram of FIG. 1. At point A the value is $k_1 * v_{in}$ where $k_1 = 10^{(ATT1/20)}$ and ATT1 (41) is negative dB.

At points B and C, $\dfrac{k_1 * v_{in}}{\sqrt{2}}$.

At point D, $\dfrac{k_1 * k_2 * v_{in}}{\sqrt{2}}$ where $k_2 = 10^{((ATT2+ATT3)/20)}$ and ATT2 (45)

and ATT3 (46) are negative.

At point E, $\dfrac{k_1 * k_3 * v_{in}}{\sqrt{2}}$ where $k_3 = 10^{((ATT4+ATT5)/20)}$ and ATT4 (47)

and ATT5 (48) are negative.

At point F, $\dfrac{k_1 * k_2 * v_{in}}{2}$.

-continued

At point G, $-\dfrac{k_1 * k_2 * v_{in}}{2}$.

At point H, $\dfrac{k_1 * k_3 * v_{in}}{2}$.

At point I, $-\dfrac{k_1 * k_3 * v_{in}}{2}$.

The selected outputs at point L out of hybrid 55 are:

$$\begin{array}{ll} \dfrac{SW1-1}{SW2-1} & \dfrac{k_1*k_2*v_{in}}{2} + j \cdot \dfrac{k_1*k_3*v_{in}}{2} \quad Phase = 0 \text{ to } +90 \\[2mm] \dfrac{SW1-1}{SW2-2} & \dfrac{k_1*k_2*v_{in}}{2} - j \cdot \dfrac{k_1*k_3*v_{in}}{2} \quad Phase = 0 \text{ to } -90 \\[2mm] \dfrac{SW1-2}{SW2-1} & -\dfrac{k_1*k_2*v_{in}}{2} + jk_1*k_3*\dfrac{v_{in}}{2} \quad Phase = 90 \text{ to } 180 \\[2mm] \dfrac{SW1-2}{SW2-2} & -\dfrac{k_1*k_2*v_{in}}{2} - jk_1*k_3*\dfrac{v_{in}}{2} \quad Phase = -90 \text{ to } -180 \end{array}$$

In general, $$v_{out} = \dfrac{v_{in}*k_1}{2} \cdot [\pm \cdot k_2 \pm jk_3].$$

An optimization strategy is one where $\sqrt{k_2^2 + k_3^2}$ is between 1 (0 dB) and 1.059 (+0.5 dB) for $k_2$ and $k_3$ varying from 0.02818(−31 dB) to 1(0 dB) in 0.5 dB steps, then the ideal loss will be between −5.5 and −6 dB. The actual loss will be greater due to component losses.

The strategy is to minimize the vector magnitude variation with phase while allowing the minimum possible phase step size for 0.5 dB resolution attenuators. Such an algorithm was developed with the absolute minimum phase step size determined to be 0.8 degrees and the worst case magnitude variation equal to 0.5 dB. The 0.8 degrees step size corresponds to approximately 9 bit resolution.

Figure 2:
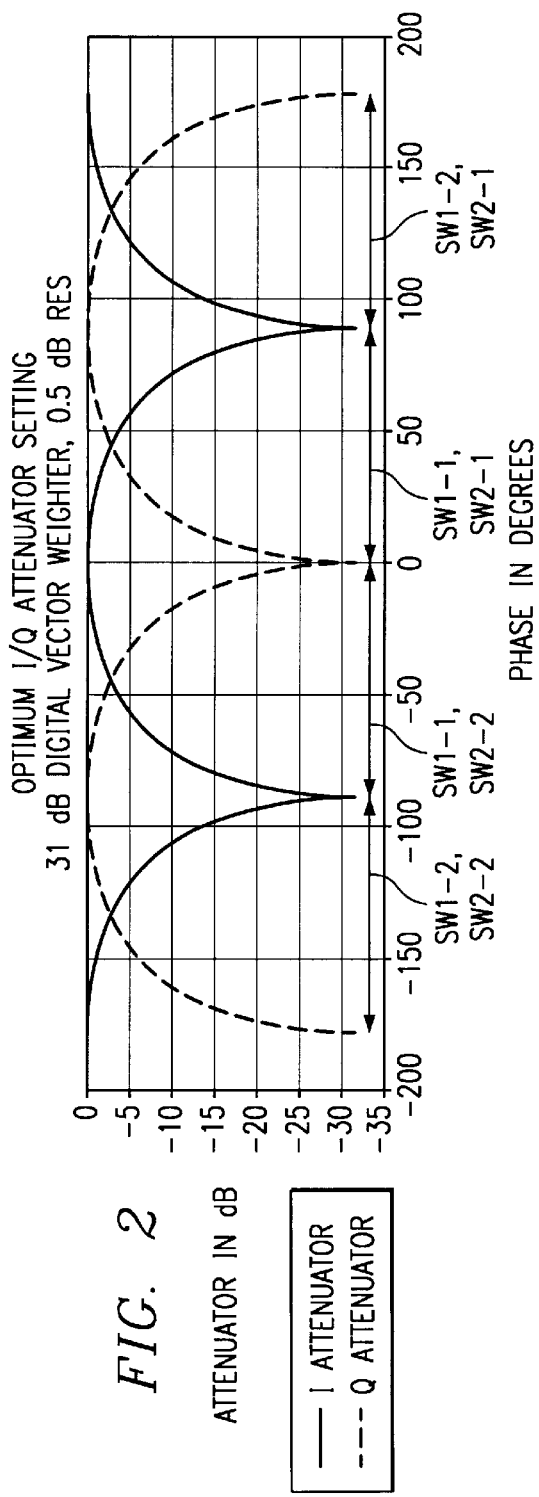
FIG. 2 is a graph of the settings for the device of FIG. 1 where the I path is represented by solid lines and Q path by dashed lines.

FIG. 2 is a graph of the optimum attenuator setting of ATT2 (45), ATT3 (46), ATT4 (47), and ATT5 (48) for phases from −180 to +180 in 1 degree increments. The switch settings are also shown on FIG. 2. In FIG. 2, SW1-2 is switch 51 providing G output, SW2—2 is switch 53 providing I output, SW1—1 is switch 51 providing F output and SW2-1 is switch 53 providing H output. The solid lines is for attenuator settings in path I and the dashed lines is for attenuator setting in path Q.

Figure 3:
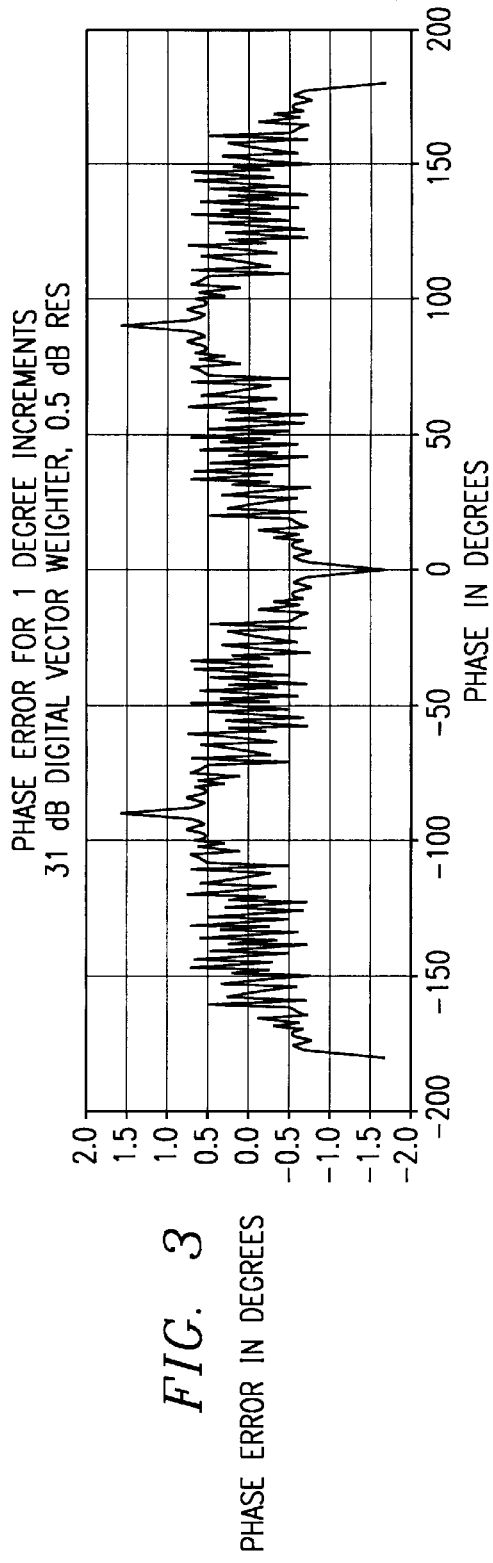
FIG. 3 illustrates the phase error using the attenuator setting of FIG. 2.

This device is optimized using two criteria. One was to realize the minimum phase error using 0.5 dB increment sizes of the I attenuators and Q attenuators and using the complete 31 dB range. The other optimization criteria was that the vector length have a maximum variation of 0.5 dB over 360 degrees. The phase error using the attenuator setting of FIG. 2 is shown in FIG. 3. The worst case errors of 1.61 degrees occurs at 0, 90, −90, and 180 degree points however, 96% of the errors are less than 0.8 degrees.

Figure 4:
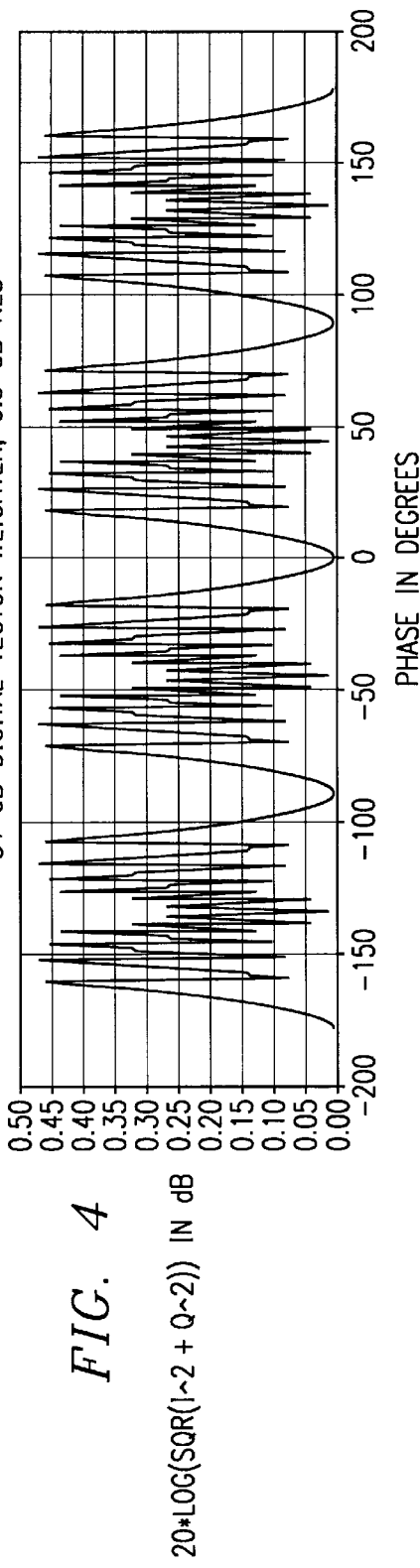
FIG. 4 illustrates the amplitude variation for the attenuator settings of FIG. 3.

The amplitude variation of vector for the attenuator settings of FIG. 2 is shown in FIG. 4.

Figure 5:
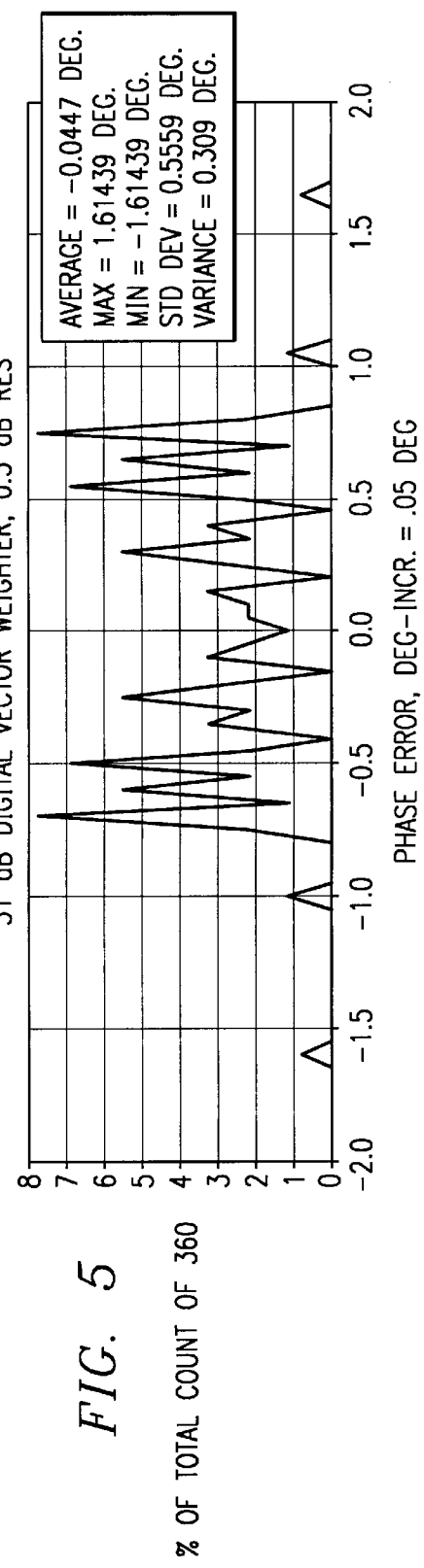
FIG. 5 illustrates the distribution of phase errors for the results shown in FIG. 3.

FIG. 5 shows the distribution of phase errors for the results shown in FIG. 3. From this graph, about 4% of the errors are greater than 1 degree with the maximum being 1.61 degrees. 96% of the errors are less than 0.8 degrees.

Figure 6:
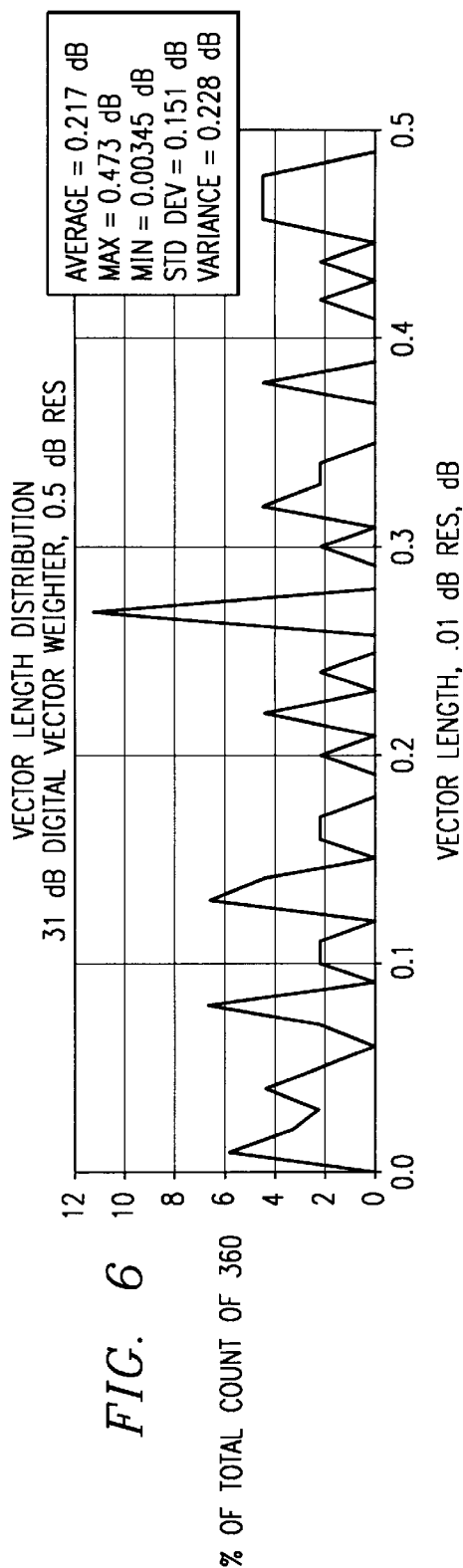
FIG. 6 illustrates the vector magnitude error distribution for the results shown in FIG. 4.

FIG. 6 shows the vector length magnitude error distributions for the results shown in FIG. 4. This shape suggests a uniform distribution of errors about the mean value of +0.217 dB (1.0253 magnitude) with a maximum error of ±0.235 dB about this mean value.

The digital processor will determine an RF phase ($\phi$) value and an RF magnitude ($k_1$) value. The desired phase angle will be defined from an I and Q value. The vector magnitude will be established by one value, $k_1$.

The I and Q values will be calculated as follows.

$I = \pm 1.0253 * COS(\phi)$ $Q = \pm 1.0253 * SIN(\phi)$ where $\phi$ will be 0 to 90 degrees in 1 degree steps and where the + or − sign will select the proper quadrant for $\phi$.

The vector magnitude will be determined from the following relationship.

$k_i = 10^{(attenuation/20)}$ where attenuation will be from 0 to −31 dB.

A lookup table in RAM (Random Access Memory) will establish the corresponding address to the digital RF vector weighting circuit.

Figure 7:
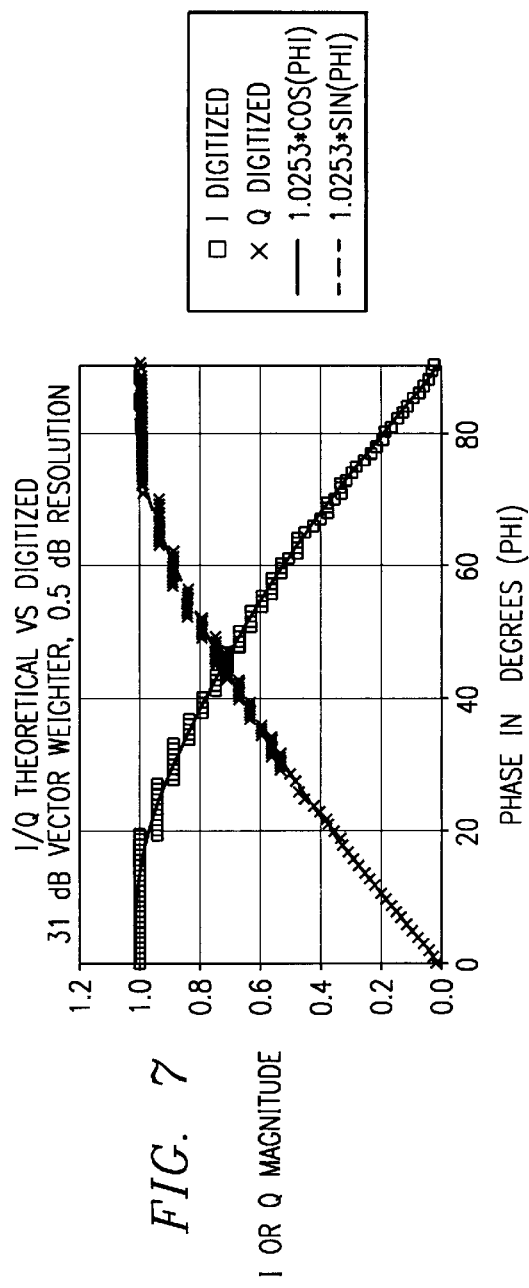
FIG. 7 shows the comparison of the digital processor calculated I and Q values with the values determined from an ideal weighter circuit.

FIG. 7 shows the comparison of the digital processor calculated I and Q values with the values determined from the ideal vector weighter circuit.

OTHER EMBODIMENTS

Although the present invention and its advantages have been described in detail, it should be understood that various changes, substitutions and alterations can be made herein without departing from the spirit and scope of the invention as defined by the appended claims.

What is claimed is:

1. An RF control device for controlling the amplitude and phase of an RF input signal, comprising, in combination:

first power divider means for power dividing the RF input signal to provide first and second power divided signals;

amplitude control means coupled to said first power divider means for separately controlling the amplitude of said first and second power divided signals;

second power divider means coupled to said amplitude control means and responsive to said first power divided signal for providing third and fourth power divided signals of opposite phase;

third power divider means coupled to said amplitude control means and responsive to said second power divided signal for providing fifth and sixth power divided signals of opposite phase;

switch means coupled to said second and third power divider means for selectively providing one of said third and fourth power divided signals at a first switch output and one of said fifth and sixth power divided signals at a second switch output;

quadrature combiner means coupled to said first and second switch outputs for combining signals from said first and second switch outputs at phase quadrature to obtain an output signal, whereby the amplitude and phase of the output signal are dependent on the selective position of the switch means and the relative amplitudes of the third, fourth, fifth and sixth power divided signals; and digital control means for effecting open loop control of said amplitude control means and said switch means in response to a desired amplitude and phase control for the input signal, by supplying to said amplitude control means and said switch means predetermined digital control information which corresponds to the desired amplitude and phase control for the input signal.

2. The RF control device of claim 1 including a RF input terminal to which the RF input signal is applied, and preliminary amplitude control means coupled between said RF input terminal and said first power divider means for controlling the overall input amplitude to said RF device.

3. The RF control device of claim 1 wherein said combiner means includes a 90° hybrid.

4. The RF control device of claim 1 wherein said amplitude control means includes digitally controlled attenuators.

5. An RF control device for controlling both the amplitude and phase of an RF input signal, comprising:

an input divider circuit operable to divide the RF input signal into first and second component signals;

a digitally controlled first amplitude control circuit operable to control the amplitude of the first component signal in order to generate a first amplitude controlled signal;

a digitally controlled second amplitude control circuit operable to control the amplitude of the second component signal in order to generate a second amplitude controlled signal;

a digitally controlled first phase control circuit operable to control the phase of the first amplitude controlled signal in order to generate a first controlled component signal;

a digitally controlled second phase control circuit operable to control the phase of the second amplitude controlled signal in order to generate a second controlled component signal;

a combiner circuit for generating an output signal by combining the first and second controlled component signals, the output signal being an amplitude and phase controlled version of the RF input signal; and a digital control circuit operable to effect open loop control of said amplitude and phase control circuits in response to a desired amplitude and phase control for the input signal, by supplying to each of said amplitude and phase control circuits predetermined digital control information which corresponds to the desired amplitude and phase control for the input signal.

6. An RF control device according to claim 5, wherein said first phase control circuit includes a first signal divider circuit operable to divide the first amplitude control signal into first and second divided signals which are of opposite phase, and a digitally controlled first switch circuit for selecting one of the first and second divided signals to be the first controlled component signal; and wherein said second phase control circuit includes a second signal divider circuit operable to divide the second amplitude controlled signal into third and fourth divided signals which are opposite phase, and a digitally controlled second switch circuit for selecting one of the third and fourth divided signals to be the second controlled component signal.

7. An RF control device according to claim 6, including a preliminary amplitude control circuit for controlling the amplitude of the RF input signal in order to generate an attentuated RF input signal which is supplied to an input of the input divider circuit.

8. An RF control device according to claim 7, wherein said first and second amplitude control circuits each include a digitally controlled attenuator.

9. An RF control device according to claim 8, wherein said input divider circuit includes an in-phase power divider, wherein said first and second signal divider circuits each include a 180° hybrid, and wherein said combiner circuit includes a 90° hybrid.

10. An RF control device according to claim 9, including a digitally controlled third switch circuit coupled to the output of said 90° hybrid.

11. An RF control device according to claim 8, wherein said digitally controlled attenuator of said preliminary amplitude control circuit has a 31 dB range and attenuates in steps of 1 dB, and wherein said digitally controlled attenuators of said first and second amplitude control circuits each include two series-coupled attenuators that each have a 15.5 dB range and each attneuate in steps of 0.5 dB.

* * * * *